(12) United States Patent
Chen et al.

(10) Patent No.: US 8,579,016 B2
(45) Date of Patent: Nov. 12, 2013

(54) HEAT DISSIPATION DEVICE WITH HEAT PIPE

(75) Inventors: Guo Chen, Shenzhen (CN); Shi-Wen Zhou, Shenzhen (CN); Chun-Chi Chen, Taipei Hsien (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 930 days.

(21) Appl. No.: 12/688,794

(22) Filed: Jan. 15, 2010

(65) Prior Publication Data

US 2011/0094711 A1 Apr. 28, 2011

(30) Foreign Application Priority Data

Oct. 22, 2009 (CN) .......................... 2009 1 0308617

(51) Int. Cl.
*F28D 15/02* (2006.01)
(52) U.S. Cl.
USPC .................................. 165/80.2; 165/104.33

(58) Field of Classification Search
USPC ........ 165/80.2, 80.3, 104.21, 104.26, 104.33; 361/697, 700, 709
See application file for complete search history.

(56) References Cited

U.S. PATENT DOCUMENTS

| | | | |
|---|---|---|---|
| 6,189,601 B1 * | 2/2001 | Goodman et al. | 165/80.3 |
| 2008/0035311 A1 * | 2/2008 | Hsu | 165/104.21 |
| 2009/0283246 A1 * | 11/2009 | Chen | 165/104.26 |

\* cited by examiner

*Primary Examiner* — Teresa Walberg
(74) *Attorney, Agent, or Firm* — Altis & Wispro Law Group, Inc.

(57) ABSTRACT

An exemplary heat dissipation device dissipating heat generated by an electronic element mounted on a printed circuit board includes a supporter, a heat conducting base, a first fin assembly and a heat pipe. The heat conducting base is securely attached to a bottom side of the supporter and thermally contacting the electronic element. The first fin assembly is securely attached to a top side of the supporter. The heat pipe includes an evaporator sandwiched between the supporter and the heat conducting base, and a condenser extending through the supporter and extending in the first fin assembly.

4 Claims, 5 Drawing Sheets

HEAT DISSIPATION DEVICE WITH HEAT PIPE

BACKGROUND

1. Technical Field

The disclosure relates to a heat dissipation device with a heat pipe.

2. Description of Related Art

Among an almost endless variety of heat dissipation devices, one kind of heat dissipation device includes a base thermally contacting a heat-generating electronic element mounted on a printed circuit board, and a number of fins disposed on the base. Most of the heat generated by the heat-generating electronic element is absorbed by the base and is conducted from the base to the fins. However, only a part of the base, usually the middle part, contacts the heat-generating electronic element. The heat originating from the heat-generating electronic element is directly absorbed by the middle part of the base, and does not very quickly spread to the other parts of the base. As a result, the middle part of the base may be overheated, while the temperature of the other parts of the base is relatively low. The fins on the other parts of the base are not efficiently utilized.

What is needed, therefore, is a heat dissipation device which can overcome the above-described shortcomings.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION

Figure 1:
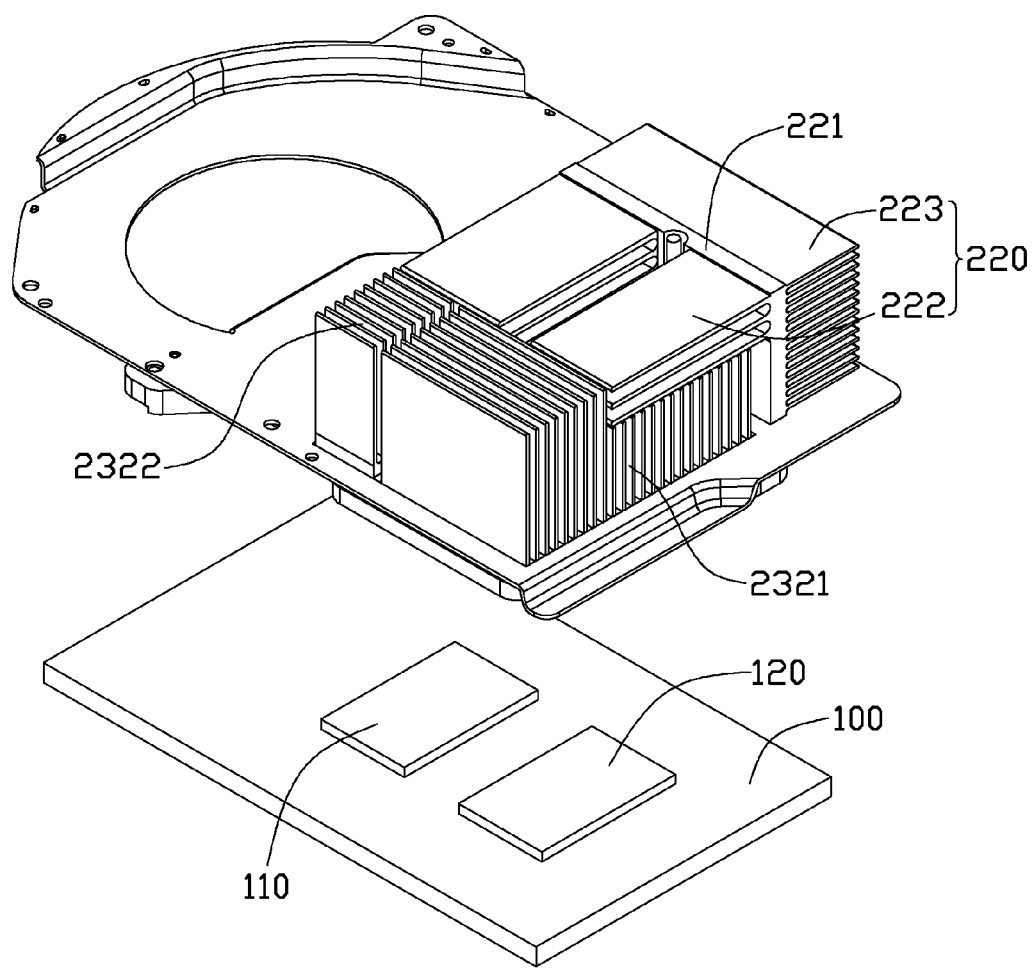
FIG. 1 is an isometric, exploded view of a heat dissipation device in accordance with an exemplary embodiment of the disclosure, and a printed circuit board.
Figure 2:
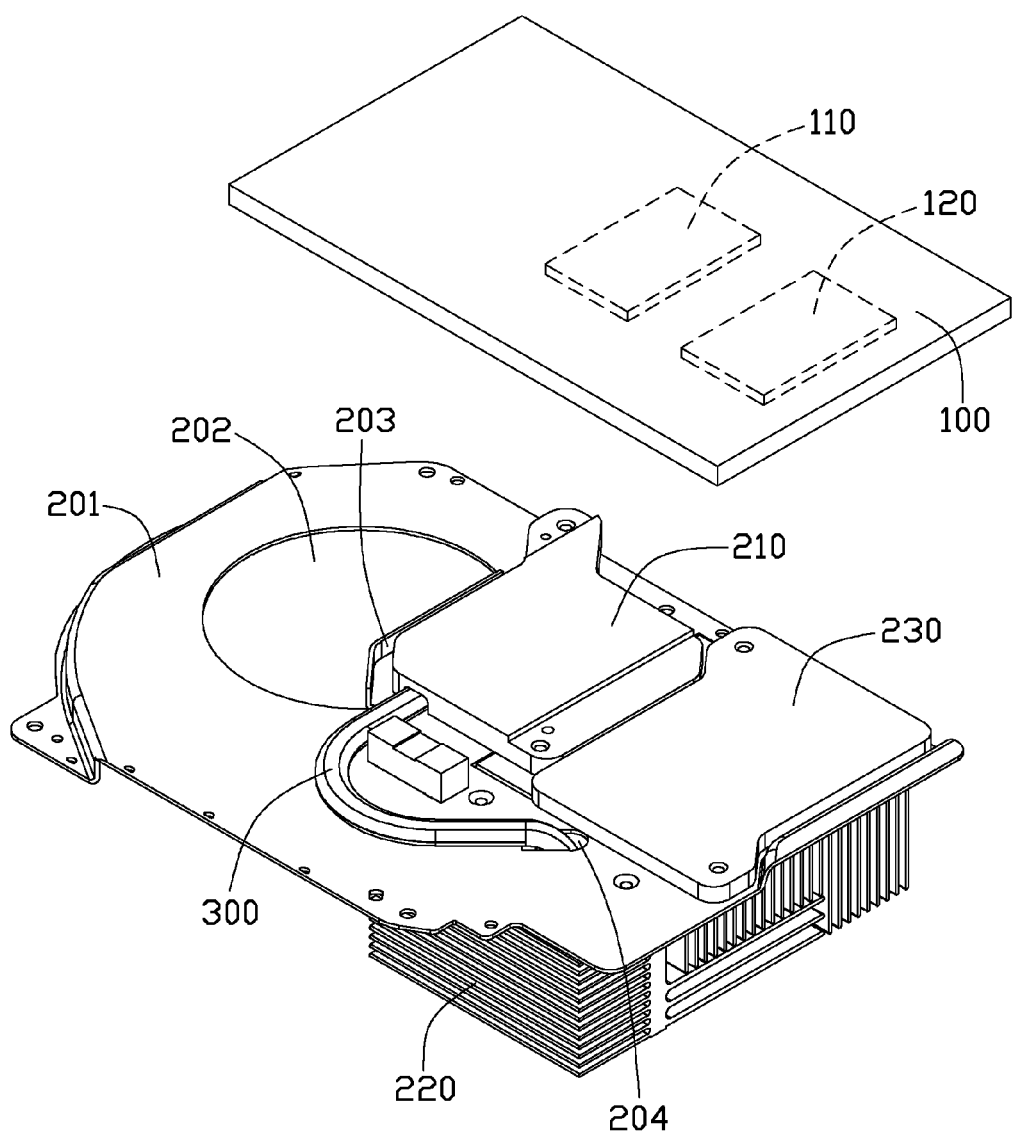
FIG. 2 is an inverted view of FIG. 1.
Figure 3:
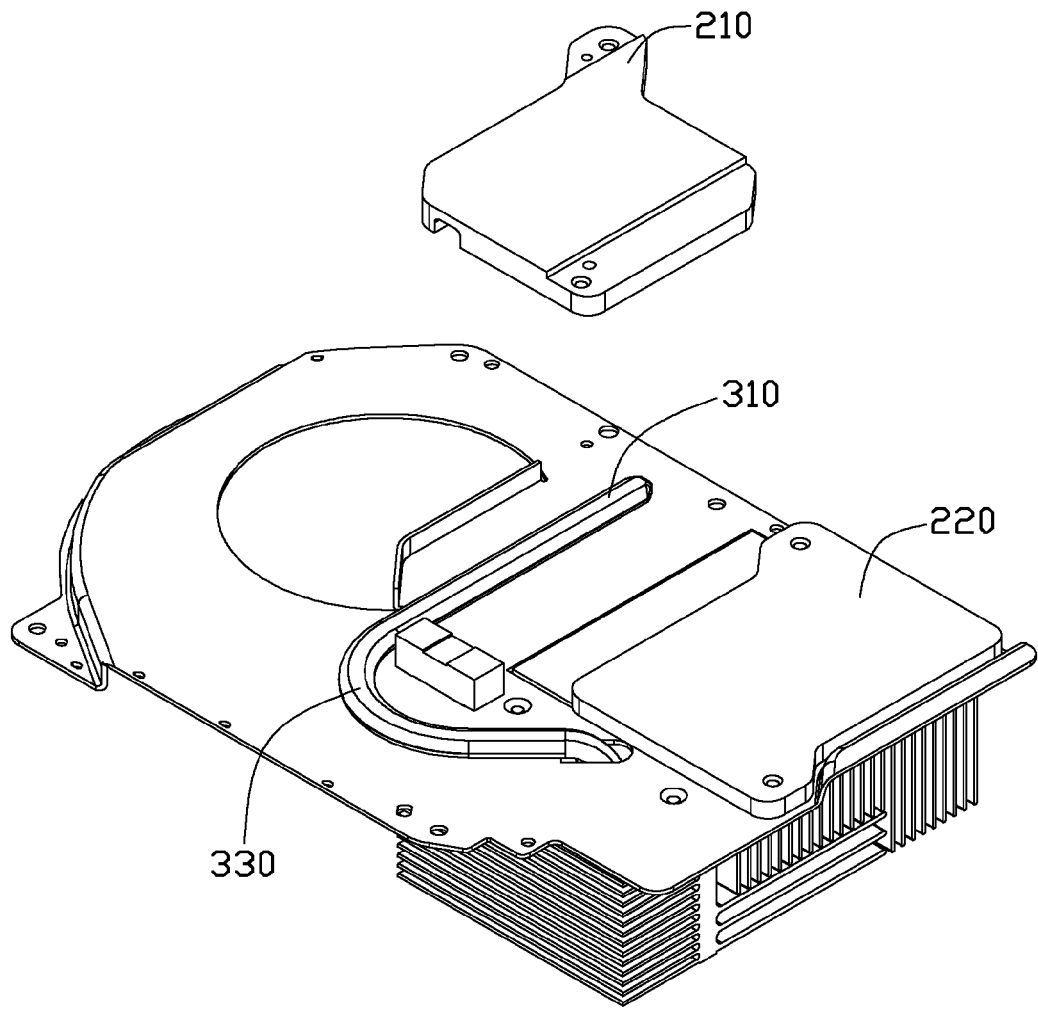
FIG. 3 is a partially exploded view of the heat dissipation device of FIG. 2.

Referring to FIGS. 1-3, an exemplary electronic device includes a printed circuit board 100, a first and second electronic elements 110, 120 mounted on the printed circuit board 100, and a heat dissipation device spreading heat of the first and second electronic elements 110, 120. Heat generated by the first electronic element 110 is larger than that generated by the second electronic element 120. For example, the first electronic element 110 is a central processing unit (CPU), and the second electronic element 120 is a peripheral electronic element such as a capacitor.

Figure 4:
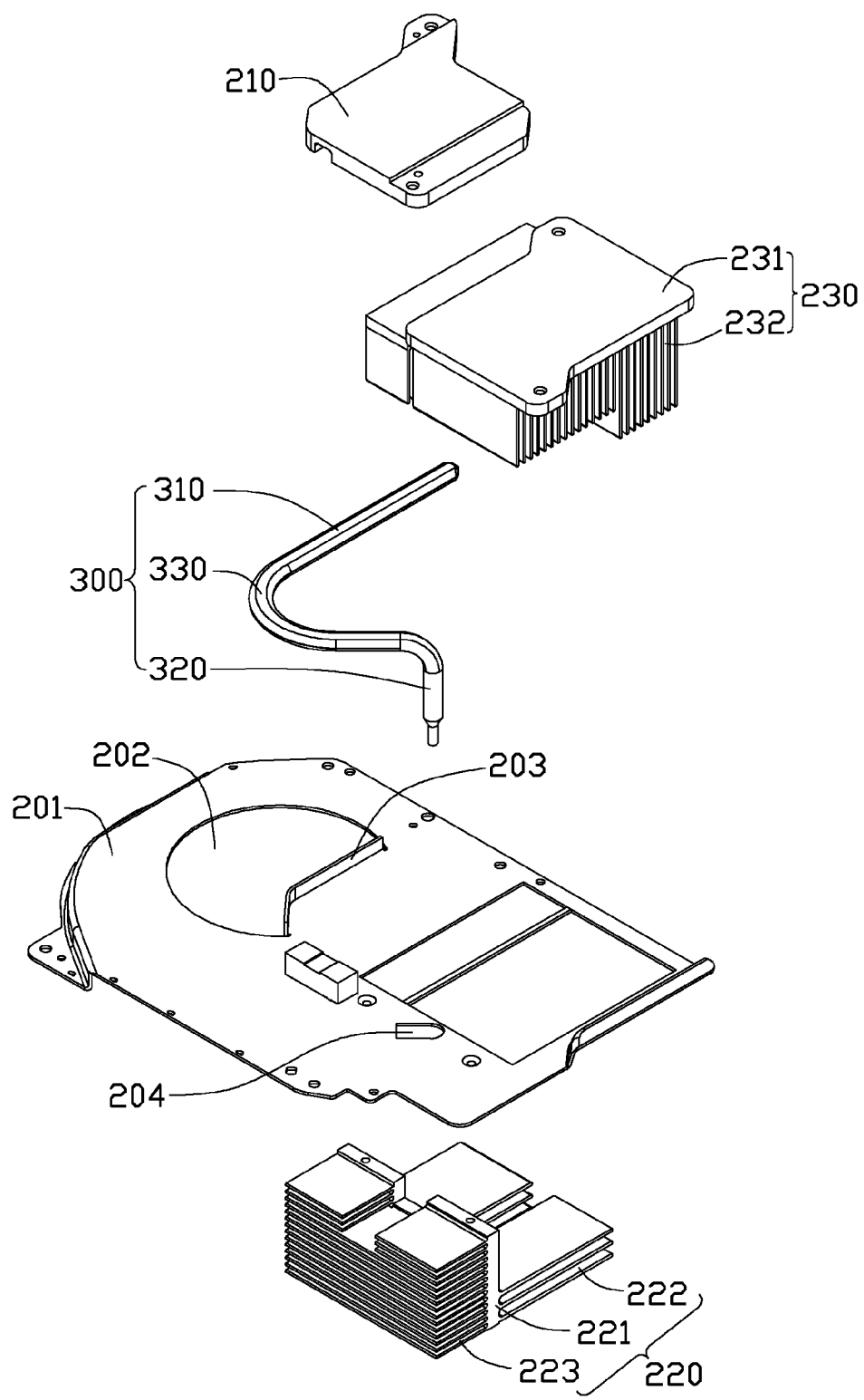
FIG. 4 is a fully exploded view of FIG. 3.
Figure 5:
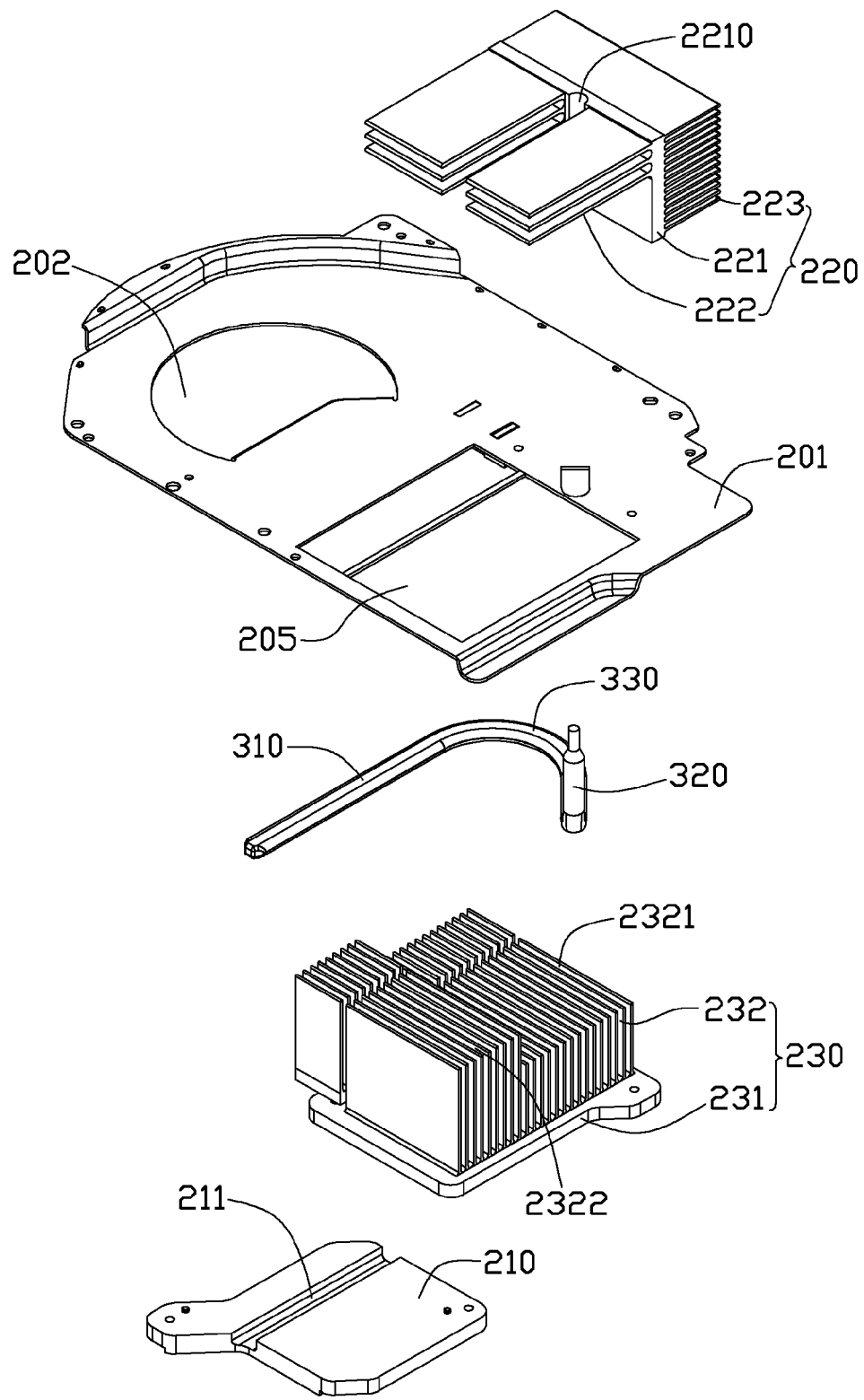
FIG. 5 is an exploded view of the heat dissipation device of FIG. 1.

The heat dissipation device includes a supporter 201, and a first heat dissipation module and a second heat dissipation module 230 secured to the supporter 201. The first heat dissipation module is used to dissipate heat generated by the first electronic element 110, and the second heat dissipation module 230 is used to dissipate heat generated by the second electronic element 120. Referring also to FIGS. 4-5, the supporter 201 is a rectangular plate, and is made of thermally conductive metallic material such as copper, aluminum, and so on. The supporter 201 defines an opening 202 at a first side thereof to correspond to a fan, and the first heat dissipation module and the second heat dissipation module 230 are mounted on a neighboring second side of the supporter 201. A baffling plate 203 extends downwardly from an edge defining the opening 202, and facilitates assembling of the first heat dissipation module and second heat dissipation module 230.

The first heat dissipation module includes a heat conducting base 210, a heat pipe 300 and a first fin assembly 220. A bottom surface of the heat conducting base 210 thermally contacts the first electronic element 110. The heat pipe 300 has a bent shape with portions extending in all three dimensions of a three-dimensional coordinate system (such as a Cartesian coordinate system). More particularly, the heat pipe 300 includes an evaporator 310, a condenser 320, and an adiabatic section 330 connected between the evaporator 310 and the condenser 320. The evaporator 310 is straight, the adiabatic section 330 is curved, and the evaporator 310 and the adiabatic section 330 are located in a common plane. The condenser 320 extends from the adiabatic section 330, and is located in another plane inclined or perpendicular to the common plane. That is, the condenser 320 is not in the common plane of the evaporator 310 and the adiabatic section 330. In the present embodiment, the evaporator 310 and the adiabatic section 330 are horizontally disposed on a bottom surface of the supporter 201, and the evaporator 310 is sandwiched between the bottom surface of the supporter 201 and a top surface of the heat conducting base 210. The bottom surface of the supporter 201 defines a groove (not labeled) receiving the evaporator 310.

The first fin assembly 220 is disposed on a top surface of the supporter 201. The condenser 320 of the heat pipe 300 is located at a top side of the supporter 201 and extends through the supporter 201 and the first fin assembly 220. In particular, the supporter 201 defines a through hole 204 therein, through which the condenser 320 extends. With this configuration, the heat generated by the first electronic element 110 and absorbed by the heat conducting base 210 is directly transferred to the first fin assembly 220 by the heat pipe 300. Thus, the heat generated by the first electronic element 110 can be rapidly spread out and is apt to not accumulate at the heat conducting base 210. The first fin assembly 220 includes a heat conducting plate 221 perpendicular to the top surface of the supporter 201, two groups of first fins 222 extending inwardly from an inner side of the heat conducting plate 221, and a number of second fins 223 extending outwardly from an outer side of the heat conducting plate 221. A groove 2210 receiving the condenser 320 is defined in the inner side of the heat conducting plate 221, and is located between the two groups of the first fins 222. The first and second fins 222, 223 are parallel with the heat conducting plate 221. The first fins 222 are disposed on a top portion of the inner side of the heat conducting plate 221, and the second fins 223 extend from a top end to a bottom end of the outer side of the heat conducting plate 221.

The second heat dissipation module 230 includes a seat 231 securely attached to the supporter 201, and a number of fins 232 perpendicularly formed on the seat 231. The supporter 201 defines a mounting opening 205 adjacent the heat conducting base 210 of the first heat dissipation module, and the seat 231 is fixed to edges defining the mounting opening 205. The fins 232 extend through the mounting opening 231 and are located at the top side of the supporter 201. The seat 231 thermally contacts the second electronic element 120 mounted on the printed circuit board 100.

The first fin assembly 220 and the second heat dissipation module 230 are disposed substantially on a same side of the supporter 201, i.e., the top side of the supporter 201. To save space, portions of the first fin assembly 220 and the second heat dissipation module 230 cross each other. The fins 232 of the second heat dissipation module 230 includes a set of low fins 2321 near the first fins 222 of the first fin assembly 220, and a set of low fins 2322 adjacent the low fins 2321. The first fins 222 of the first fin assembly 220 are located over the low fins 2321 of the second heat dissipation module 230, and extend up to a same height as the high fins 2322. The low and high fins 2321, 2322 are perpendicular to the first fins 222; and correspondingly, air passages defined by the low and high fins 2321, 2322 are perpendicular to air passages defined by the first fins 222. With the crossed configuration, the first heat dissipation module and the second heat dissipation module 230 dissipate the heat of the first and second electronic elements 110, 120, respectively. Cooling air driven by the fan flows from the first side of the supporter 201 to the second side of the supporter 201 and flows into the air passages of the first fins 222 of the first fin assembly 220 and the second heat dissipation module 230, thereby simultaneously dissipating the heat of the first fin assembly 220 and the second heat dissipation module 230.

It is understood that the first fin assembly 220 and the second heat dissipation module 230 can be secured to the supporter 201 by bolting, welding or other suitable means. According to the amount of heat expected to be output from the first electronic element 110, two or more heat pipes 300 may be applied to the first heat dissipation module to dissipate the heat generated by the first electronic element 110.

When the electronic device works, the heat generated by the first electronic element 110 is absorbed by the heat conducting base 210, is directly transferred to the evaporator 310 of the heat pipe 300, is subsequently transferred to the condenser 320 of the heat pipe 300, and is then subsequently transferred to the first fins 220 to dissipate out to ambient air. To save space, one part of the first heat dissipation module is disposed at the bottom side of the supporter 201, i.e., the heat conducting base 210 and the evaporator 310 are located at the bottom side of the supporter 201; and another part of the first heat dissipation module is disposed at the top side of the supporter 201, i.e., the first fins 220 are located at the top side of the supporter 201. The heat generated by the first electronic element 110 below the supporter 201 is transferred from the bottom side to the top side of the supporter 201 by the bent shaped heat pipe 300. Therefore, the bent shaped heat pipe 300 enables the first heat dissipation module to have a relatively small volume, and simultaneously improves the heat dissipating efficiency of the first heat dissipation module.

It is to be understood, however, that even though numerous characteristics and advantages of the present embodiments have been set forth in the foregoing description, together with details of the configurations and functions of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

The invention claimed is:

1. A heat dissipation device dissipating heat generated by an electronic element mounted on a printed circuit board, the heat dissipation device comprising:
 a supporter;
 a heat conducting base attached to a bottom side of the supporter and thermally contacting the electronic element;
 a first fin assembly attached to a top side of the supporter; and
 a heat pipe comprising an evaporator, a condenser, and an adiabatic section interconnecting the evaporator and the condenser, the condenser being not in a common plane defined by the evaporator and the adiabatic section, the evaporator sandwiched between the supporter and the heat conducting base, the heat pipe extending through the supporter, and the condenser extending in the first fin assembly;
 wherein the evaporator and the adiabatic section are horizontally disposed on a bottom surface of the supporter, and the condenser is perpendicular to the common plane defined by the evaporator and the adiabatic section.

2. The heat dissipation device of claim 1, wherein the heat conducting base defines a groove receiving the evaporator therein.

3. A heat dissipation device for dissipating heat generated by at least one electronic element mounted on a printed circuit board, the heat dissipation device comprising:
 a first heat dissipation module for dissipating heat generated by a first electronic element mounted on the printed circuit board, the first heat dissipation module comprising a supporter, a heat conducting base disposed on a bottom side of the supporter and configured for thermally contacting the first electronic element, a first fin assembly disposed on a top side of the supporter, and a bent heat pipe thermally connecting the heat conducting base to the first fin assembly;
 wherein the heat pipe comprises an evaporator sandwiched between the supporter and the heat conducting base, a condenser thermally engaged with the first fin assembly, and an adiabatic section connected between the evaporator and the condenser, the condenser being not in a common plane defined by the evaporator and the adiabatic section; and
 wherein the evaporator and the adiabatic section are mounted at a bottom surface of the supporter, the heat pipe extends through the supporter, and the condenser extends in the first fin assembly.

4. A heat dissipation device dissipating heat generated by an electronic element mounted on a printed circuit board, the heat dissipation device comprising:
 a supporter;
 a heat conducting base attached to a bottom side of the supporter and thermally contacting the electronic element;
 a first fin assembly attached to a top side of the supporter, the first fin assembly comprising a heat conducting plate, a plurality of first fins extending inwardly from an inner side of the heat conducting plate, and a plurality of second fins extending outwardly from an outer side of the heat conducting plate;
 a second fin assembly comprising a seat attached to the top side of the supporter and a plurality of fins perpendicularly formed on the seat, the fins of the second fin assembly being perpendicular to the first fins of the first fin assembly; and
 a heat pipe comprising an evaporator, a condenser, and an adiabatic section interconnecting the evaporator and the condenser, the condenser being not in a common plane defined by the evaporator and the adiabatic section, the evaporator sandwiched between the supporter and the heat conducting base, the heat pipe extending through the supporter, and the condenser extending in the first fin assembly.

* * * * *